United States Patent
Chiang

(10) Patent No.: US 7,266,039 B2
(45) Date of Patent: Sep. 4, 2007

(54) CIRCUITRY AND METHOD FOR ADJUSTING SIGNAL LENGTH

(75) Inventor: Ju-An Chiang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 110 days.

(21) Appl. No.: 11/178,169

(22) Filed: Jul. 8, 2005

(65) Prior Publication Data

US 2007/0008792 A1    Jan. 11, 2007

(51) Int. Cl.
*G11C 8/18* (2006.01)
*G11C 8/00* (2006.01)

(52) U.S. Cl. .................. 365/233.5; 365/233; 327/31
(58) Field of Classification Search ............ 365/233.05
See application file for complete search history.

(56) References Cited

U.S. PATENT DOCUMENTS

| | | | | |
|---|---|---|---|---|
| 5,493,538 A | * | 2/1996 | Bergman ................. | 365/233.5 |
| 5,548,560 A | * | 8/1996 | Stephens et al. .......... | 365/233.5 |
| 5,576,996 A | | 11/1996 | Awaya et al. .......... | 365/189.01 |
| 5,606,269 A | * | 2/1997 | Pontius et al. ................ | 326/93 |
| 6,016,284 A | * | 1/2000 | Itagaki et al. ............ | 365/233.5 |
| 6,021,089 A | * | 2/2000 | Hwang .................... | 365/233.5 |
| 6,122,221 A | * | 9/2000 | Rezeanu ................... | 365/233.5 |
| 6,169,423 B1 | | 1/2001 | Campardo et al. ............ | 327/26 |
| 6,646,956 B2 | * | 11/2003 | Takahashi et al. ........ | 365/233.5 |
| 6,967,521 B2 | * | 11/2005 | Lee ............................ | 327/512 |
| 7,126,400 B2 | * | 10/2006 | Tamura ...................... | 327/261 |

FOREIGN PATENT DOCUMENTS

JP                04-274100            9/1992

* cited by examiner

Primary Examiner—Son L. Mai
(74) Attorney, Agent, or Firm—J.C. Patents

(57) ABSTRACT

A circuit for adjusting a signal length is adapted for a memory device. The circuit adjusts a signal length of an ATD signal. The circuit includes a timing module, an encoding module and a logical control unit. Wherein, the timing module generates a plurality of timing signals according a pulse generated by the ATD signal. The encoding module is coupled to one of the data lines of the memory device. The timing signals are registered and encoded to generate a time value according to the status of the data output from the memory device. In addition, the logic control unit compares the present time value and the previous time value to generate a comparison result. The signal length of the ATD signal is adjusted according to the comparison result.

16 Claims, 4 Drawing Sheets

CIRCUITRY AND METHOD FOR ADJUSTING SIGNAL LENGTH

BACKGROUND OF THE INVENTION

1. Field of the Invention

The present invention relates to a circuit, and more particularly to a circuit for adjusting a signal length which can be applied to an electronic storage device.

2. Description of the Related Art

For many memory devices, an address transition detection (ATD) signal generation circuit has been used to generate ATD signal. The memory device receives several bit-of address signals to identify the registration locations of the data in the memory device. Generally, speaking address signals are received by several address buffers. Each address buffer provides signal transition and buffering functions, and generates signals for decoding subsequent addresses. For response of any transition of any bit of the input address signal, ATD signal generation circuit always generates ATD signal. In addition to the address signals, other input signals may also trigger the ATD signal generation circuit to generate the ATD signal. These signals include chip enable signal and write enable signal. Both of them control the operation of the memory device.

Normally, before the address transition, the ATD signal has a logic 0 level. In order to respond to the address transition, the ATD signal generation circuit generates a logic-1 level pulse. The duration of the pulse, such as 10 ns, is determined by the timing unit of the ATD signal generation circuit. If the subsequent address transition occurs in the duration of the pulse, the pulse counting value is reset to maintain the integrity of the duration of the pulse.

In addition, the timing of some internal operations is performed by the timing response of the ATD signal. The internal operation comprises decoding the input addresses to select only one storage area for data read/write in the memory device. Beside, the ATD signal can serve as a synchronous signal.

Ideally, the duration of the ATD signal is equal to the worst decoding time of the whole memory device. Actually, due to the process and electrical property variation, the duration cannot be well controlled. In the conventional ATD signal generation circuit, a theoretically predetermined time is set, which is not adjustable. However, an improper duration of the ATD signal not only turns on the pumping circuit prematurely, but also affects the read/write speed of the memory device. In addition, it also turns on the sense amplifier of the data line prematurely, wasting some power unnecessarily.

In order to solve the problem described above, in the U.S. Pat. No. 6,169,423, voltages of word lines are used to adjust the duration of the ATD signal. The U.S. patent, however, has a disadvantage. Due to the limitation of the differential input terminal of the sense amplifier, the read speed for logic 0 level and logic 1 level are different. Accordingly, even if voltages of two word lines reach above the pre-set value, the two word lines do not necessarily have the same subsequent sensing speed for data. Moreover, the optimized duration of the ATD signal cannot be precisely obtained.

SUMMARY OF THE INVENTION

Accordingly, the present invention is directed to a circuit for adjusting a signal length. The circuit can adjust the length of the address transition detection (ATD) signal to the optimized status.

The present invention is also directed to a circuit for adjusting a signal length capable of controlling the proper turn-on time of the output buffer of the memory device to avoid the variation of output data.

The present invention is also directed to a method for adjusting a signal length, capable of dynamically adjusting the signal length to immediately reach the optimized status.

The present invention provides a circuit for adjusting a signal length adapted for an electronic storage device. The circuit comprises a timing module, and an encoding module. Wherein, the timing module receives a first signal, a third signal and a fifth signal from a first signal terminal, and generates a plurality of first timing signals and a plurality of second timing signals. The encoding module is coupled to the timing module. The encoding module receives a second signal and a fourth signal from a second signal terminal, the first timing signals and the second timing signals, and generates a first time value and a second time value. In addition, the circuit also comprises a logic control unit, which is coupled to the encoding module. The logic control unit compares the first time value and the second time value, and generates a comparison result to adjust a signal length of the fifth signal.

In an embodiment of the present invention, the timing module comprises a register and a variable delay circuit. Wherein, the register receives the first signal and the third signal from the first signal terminal. The variable delay circuit is coupled to the register, separately generating the first timing signals and the second timing signals for the encoding module.

In addition, the encoding module comprises a first shift register, a second shift register, a first encoding unit and a second encoding unit. Wherein, the first shift register separately receives the first timing signals and the second timing signals according to the second signal and the fourth signal from the second signal terminal, respectively, and registers the second timing signals to output the first timing signals. The first encoding unit is coupled to the first shift register, encodes the second timing signals registered in the first shift register, and generates the first time value. The second shift register is coupled to the first shift register, to receive the first timing signals outputted from the first shift register, and registers output the first timing signals to the second encoding unit. The second encoding unit is coupled to the second shift register, encodes the first timing signals registered in the second shift register, and generates the second time value.

Under a preferred situation, the electronic storage device comprises a memory device. The first signal, the third signal and the fifth signal are address transition detection (ATD) signal of the memory device. The second signal and the fourth signal are generated when data on a data line of the memory device varies.

Accordingly, in the present invention, the ATD signal is adjusted according to the status of the data lines. The magnifying speed of the sense amplifier of the memory device can be considered so that the signal length of the ATD signal can be optimized. In addition, due to the optimization of the signal length of the ADT signal, the optimized turn-on time of the output buffer can be obtained so that the output data are stable. In addition, in the present invention, the present time value and the previous time value are compared to dynamically optimize the signal length.

The above and other features of the present invention will be better understood from the following detailed description of the embodiments of the invention that is provided in communication with the accompanying drawings.

DESCRIPTION OF SOME EMBODIMENTS

Figure 1:
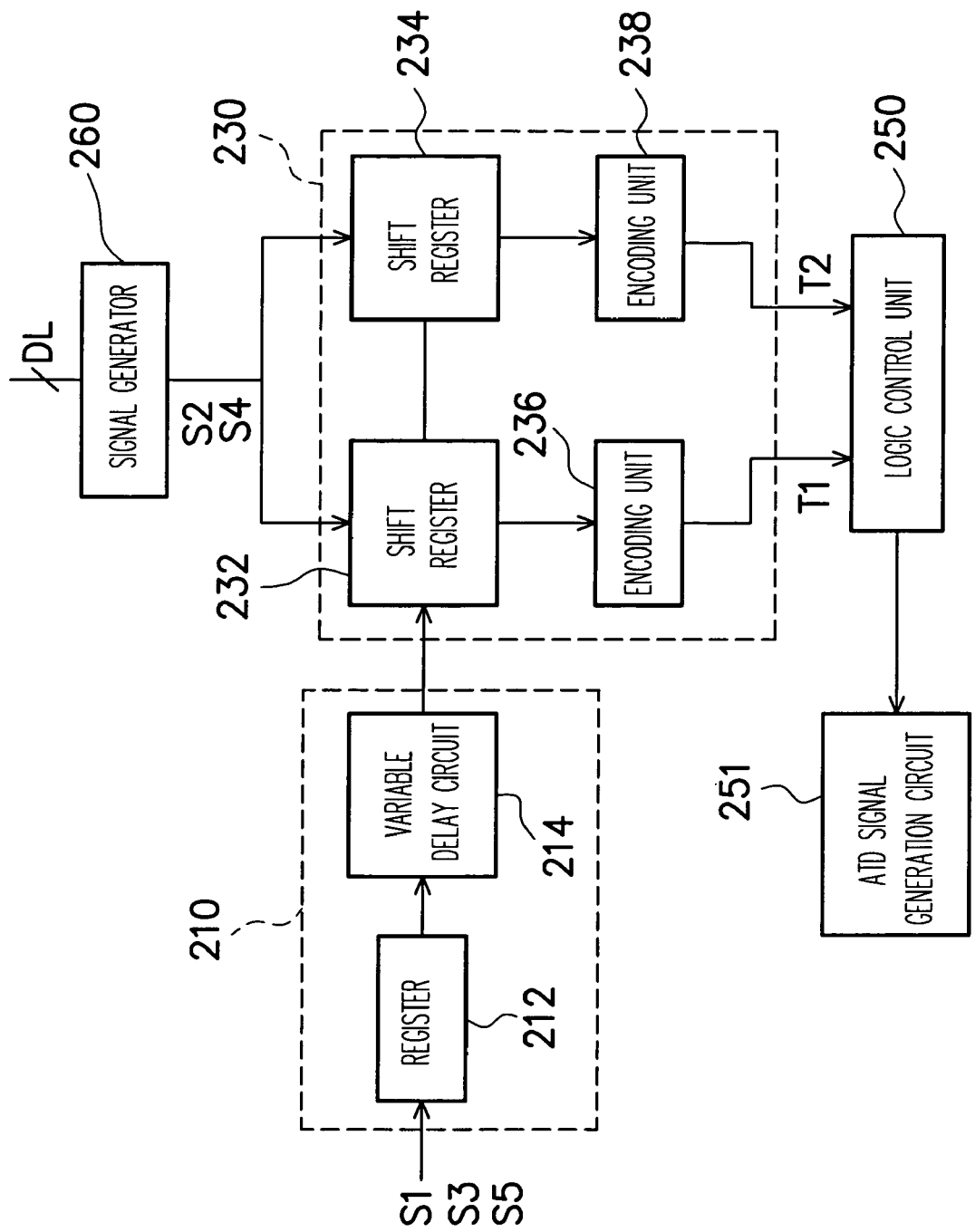
FIG. 1 is a circuit block diagram showing a circuit for adjusting a signal length according to a preferred embodiment of the present invention.

FIG. 1 is a circuit block diagram showing a circuit for adjusting a signal length according to a preferred embodiment of the present invention. Referring to FIG. 1, the timing module 210 receives a first signal S1, and its output terminal is coupled to the encoding module 230. The encoding module 230 generates a time value to the logic control unit 250 according to the second signal S2. Wherein, the first signal S1 and the second signal S2 have a cause-effect relationship.

In this embodiment, the second signal S2 can be generated by the signal generator 260. Wherein, the signal generator 260 is coupled to a plurality of data lines DL and to the encoding module 230. The signal generator 260 generates the second signal S2 through the data variation of the data lines DL, and outputs the second signal S2 to the encoding module 230.

Figure 2:
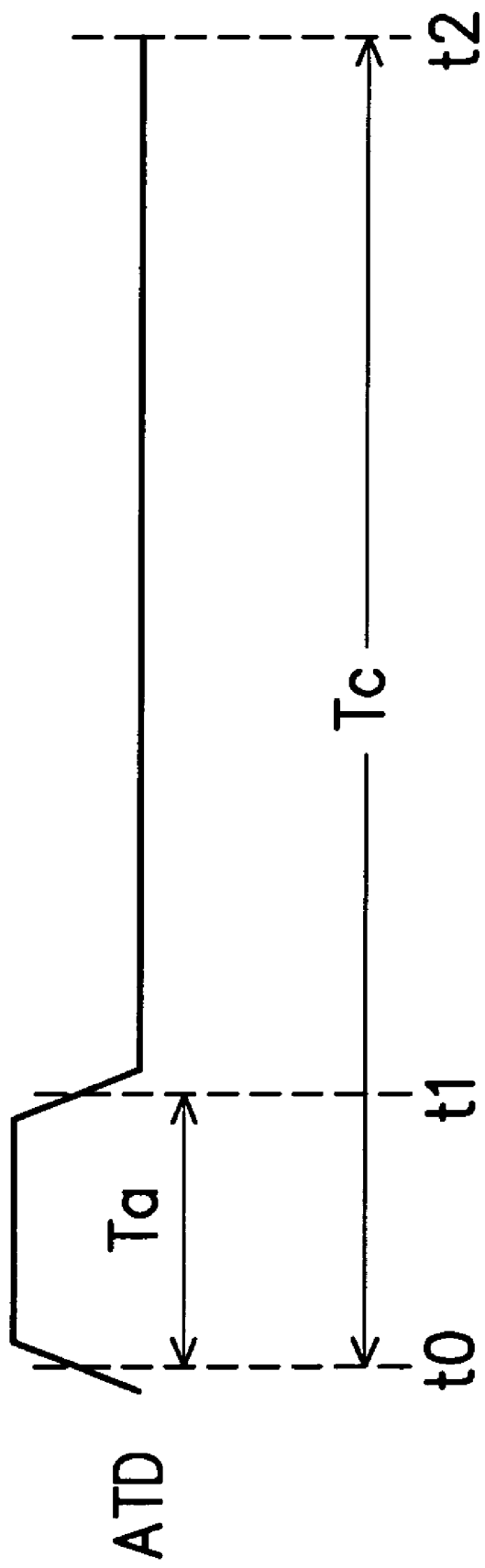
FIG. 2 is a drawing showing a sequence of an ATD signal.

In addition, in this embodiment of the present invention, the first signal S1 can be an address transition detection (ATD) signal. That is, when the ATD signal of the memory device is enabled, a pulse signal is triggered according to its rising edge in this embodiment. FIG. 2 is a drawing showing a sequence of an ATD signal. Referring to FIG. 2, at the time t0, the ATD signal is enabled. At the same time, the rising edge triggers a pulse signal. At the time t1, the ATD signal switches from the high level to the low level. Meanwhile, the internal circuit of the memory device performs detail operations for a series of read/write operations. At the time t2, the detail operations in the internal circuit of the memory device are complete, and the data is output. In general, the signal length from the time of enabling the ATD signal to the time of outputting the data after the memory device finishes all detailed operations, typically, is about 70 ns.

Referring to FIG. 1, the timing module 210 comprises a register 212 and a variable delay circuit 214. Wherein, the register 212 receives the first signal S1, and its output terminal is coupled to the variable delay circuit 214. In addition, the output terminal of the variable delay circuit 214 is coupled to the encoding module 230.

The encoding module 230 comprises the shift registers 232 and 234, which are coupled to the signal generator 260, and the output terminal of the variable delay circuit 214 of the timing module 210. In addition, the output terminals of the shift registers 232 and 234 are coupled to the encoding units 236 and 238, respectively. Under a preferred situation, the encoding units 236 and 238 may comprise priority encoders. In this embodiment of the present invention, the encoding units 236 and 238 encode the outputs from the shift registers 232 and 234, respectively, and output the encoding results to the logic control unit 250.

Figure 3:
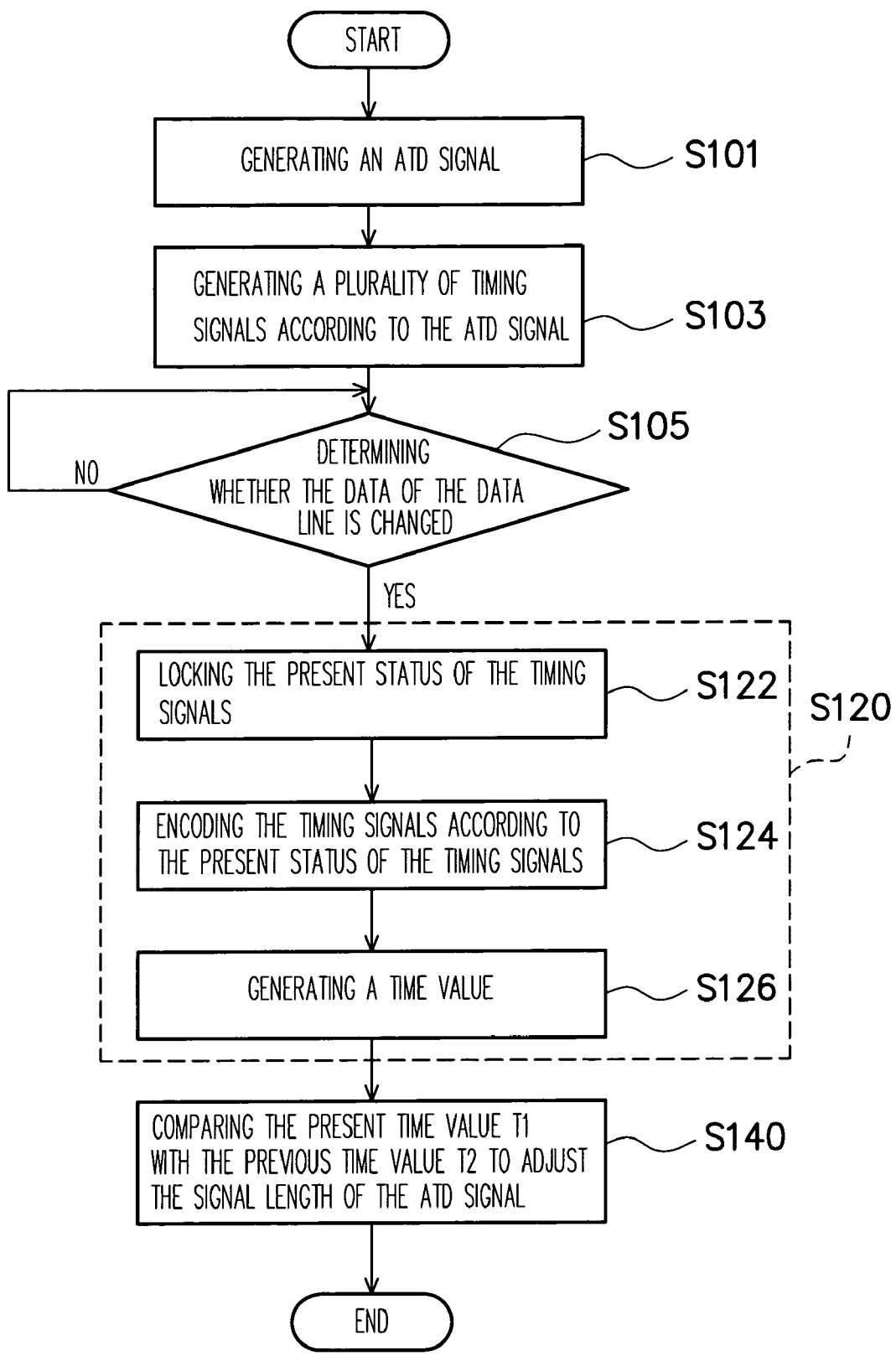
FIG. 3 is a flowchart showing a method for adjusting a signal length according to a preferred embodiment of the present invention.

FIG. 3 is a flowchart showing a method for adjusting a signal length according to a preferred embodiment of the present invention. Referring to FIGS. 1 and 3, in order for one of ordinary skill in the art to understand the feature of the present invention, an ATD signal serves as the first signal S1 in the following embodiment. The present invention, however, is not limited thereto. In the step S101, when the memory device generates the ATD signal, i.e., the first signal S1, the variable delay circuit 214 generates outputs through the register 212. Meanwhile, the variable delay circuit 214, such as a propagation-delay digital timer, generates a plurality of timing signals (the first timing signals here) to the shift register 232 in the step S103.

When the shift register 232 receives the timing signals generated by the variable delay circuit 214, it is checked whether the status of the data of the data lines DL, the DL in FIG. 1 which has a cause-effect relationship with the ATD signal, is changed. If the status of the data of the data lines DL has changed ("Yes" in the step S105), the second signal S2 is generated, and the step S120 is performed to generate a time value according to the output of the variable delay circuit 214.

The following is a detailed description of the step S120. In this embodiment, when the encoding module 230 receives the second signal S2, the shift register 232 locks the status of the first timing signals output from the variable delay circuit 214 in the step S122. The encoding unit 236 encodes the first timing signals according to the status of the first timing signal in the step S124. In the step S126, the time value is generated to the logic control unit 250.

When the next ATD signal (the third signal S3) is enabled, the step S105 is repeated. The signal generator 260 generates a newest output, the fourth signal S4, corresponding to the third signal S3. Similarly, when the encoding module 230 receives the fourth signal S4, the step S122 is repeated to lock the newest timing signals, the second timing signals, output from the variable delay circuit 214. At this moment, the shift register 232 outputs the first timing signals to the shift register 234 and registers the second timing signals according to the fourth signal. The encoding units 236 and 238 simultaneously encode the first timing signals and the second timing signals according to the status of the second timing signals and the status of the first timing signals, respectively, as shown in the step S124. In the step S126, the time values T1 and T2 are generated and output to the logic control unit 250, which T1 is the present time value and T2 is the previous time value.

After the encoding units 236 and 238 outputs the time values T1 and T2 to the logic control unit 250, respectively, the logic control unit 250 compares the present time value T1 and the previous time value T2 in the step S140, and generates a comparison result to adjust the signal length of the next ATD signal (the fifth signal S5). The signal length is Ta shown in FIG. 2.

Figure 4:
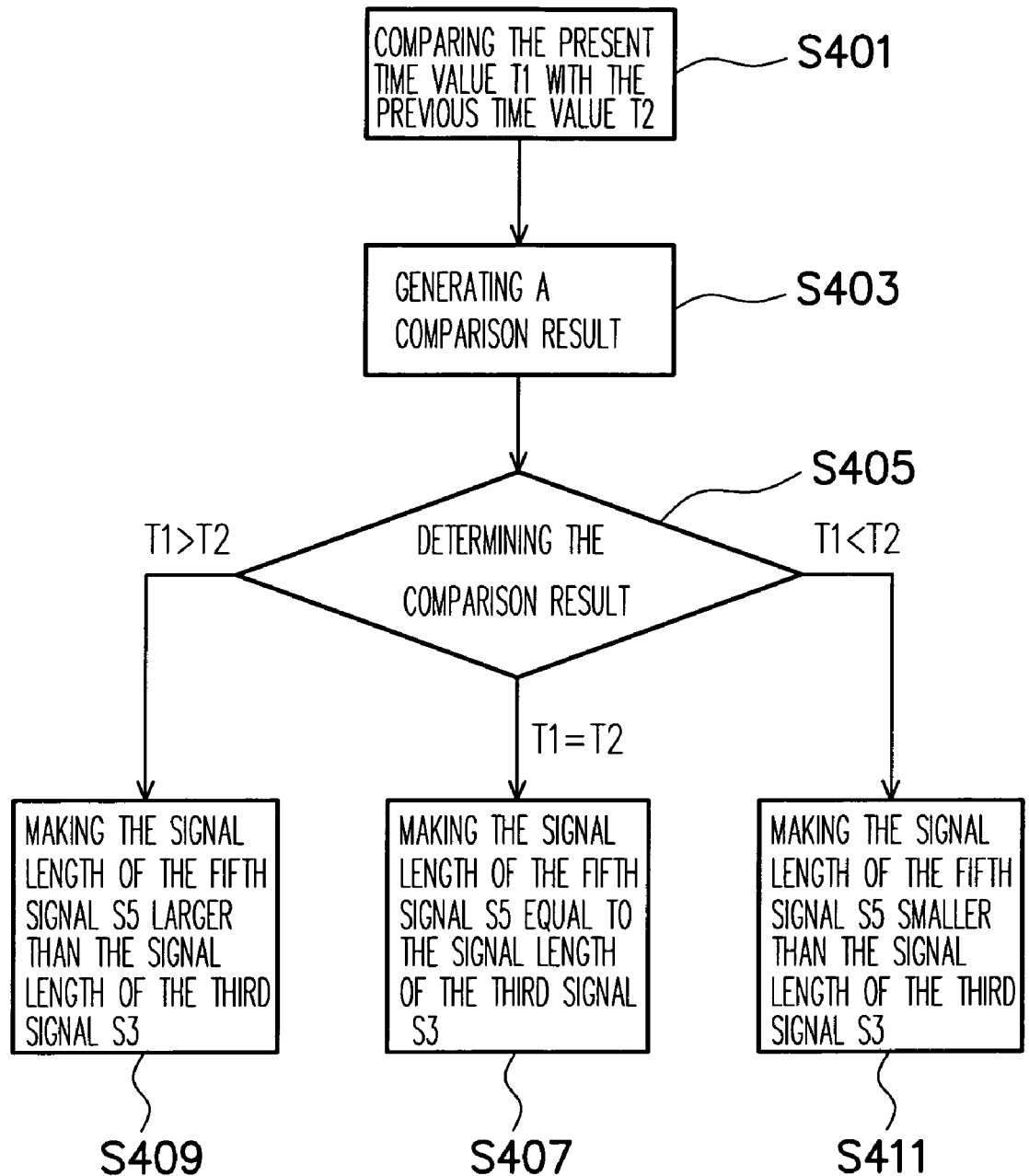
FIG. 4 is a flowchart showing a method for adjusting a signal length of the fifth signal according to a time value in a preferred embodiment of the present invention.

The following is a description of an embodiment of adjusting the signal length of the fifth signal S5 (the ATD signal), according to the time value. FIG. 4 is a flowchart showing a method for adjusting a signal length of the fifth signal according to a time value of a preferred embodiment of the present invention. Referring to FIGS. 3 and 4, the logic control unit 250 receives and compares the time values T1 and T2 in the step S401. In the step S403, a comparison result is generated. In the step S405, the logic control unit 250 determines the comparison result of the time values T1 and T2 to adjust the signal length of the ATD signal S5 which is to be generated by the memory device.

Generally, an ATD signal is generated by an ATD signal generation circuit 251. If determining that the time value T1 is equal to the time value T2, the logic control unit 250 controls the ATD signal generation circuit 251 so that the signal length of the fifth signal S5 is equal to the signal length of the third signal S3 in the step S407. If it is determined that the time value T1 is larger than the time value T2, the signal length of the fifth signal S5 has room for extension. Accordingly, the logic control unit 250 controls the ATD signal generation circuit 251, for example, so that the signal length of the fifth signal S5 is larger than the signal length of the third signal S3 in the step S409. Contrarily, if determining that the time value T1 is smaller than the time value T2, the logic control unit 250 controls the ATD signal generation circuit 251, for example, so that the signal length of the fifth signal S5 is smaller than the signal length of the third signal S3 in the step S411. Accordingly, in the present invention, the signal length of the ATD signal can be dynamically adjusted according to the present time value T1 and the previous time value T2, for example.

Accordingly, the present invention comprises at least the following advantages:
1. In the present invention, the present time value and the previous time value are constantly compared to dynamically adjust the signal length.
2. In the present invention, the comparison result of the present time value and the previous time value is used to adjust the signal length. The signal length thus can be optimized.
3. In the present invention, due to the optimization of the signal length of the ATD signal, the output buffer has the optimized turn-on timing and the output data can be stable.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A circuit for adjusting a signal length, adapted for an electronic storage device, the circuit comprising:
    a timing module, receiving a first signal, a third signal and a fifth signal from a first signal terminal, and generating a plurality of first timing signals and a plurality of second timing signals;
    an encoding module, coupled to the timing module, the encoding module receiving a second signal and a fourth signal from a second signal terminal, and the first timing signals and the second timing signals, and generating a first time value and a second time value; and
    a logic control unit, coupled to the encoding module, the logic control unit comparing the first time value and the second time value, and generating a comparison result to adjust a signal length of the fifth signal.

2. The circuit of claim 1, wherein the electronic storage device comprises a memory device.

3. The circuit for adjusting a signal length of claim 2, wherein the memory device comprises a non-synchronous memory.

4. The circuit for adjusting a signal length of claim 1, wherein the timing module comprises:
    a register, receiving the first signal and the third signal from the first signal terminal; and
    a variable delay circuit, coupled to the register, separately generating the first timing signals and the second timing signals to the encoding module.

5. The circuit for adjusting a signal length of claim 1, wherein the encoding module comprises:
    a first shift register, receiving the first timing signals and the second timing signals according to the second signal and the fourth signal from the second signal terminal, respectively, and registering the second timing signals and outputting the first timing signals;
    a first encoding unit, coupled to the first shift register, encoding the second timing signals registered in the first shift register, and generating the first time value;
    a second shift register, coupled to the first shift register, receiving the first timing signals output from the from the first shift register according to the fourth signal, and registering the first timing signals; and
    a second encoding unit, coupled to the second shift register, encoding the first timing signals registered in the second shift register, and generating the second time value.

6. The circuit for adjusting a signal length of claim 5, wherein the first encoding unit and the second encoding unit are priority encoders.

7. The circuit for adjusting a signal length of claim 1, further comprising
    a signal generator, coupled to a plurality of data lines and the second signal terminal, generating the second signal and the fourth signal in response to data variation of the data lines.

8. A method for adjusting a signal length, adapted for an electronic device, the adjusting method comprising the following steps:
    generating a first signal from a first signal terminal;
    obtaining a plurality of first timing signals according to the first signal;
    receiving a second signal from a second signal terminal, the first signal and the second signal having a cause-effect relationship; and
    obtaining a first time value according to the first timing signals, further comprising the following steps:
        locking a status of the first timing signals; and
        encoding the first timing signals according to the status of the first timing signals to generate the first time value.

9. A method for adjusting a signal length, adapted for an electronic device, the adjusting method comprising the following steps:
    generating a first signal from a first signal terminal;
    obtaining a plurality of first timing signals according to the first signal;
    receiving a second signal from a second signal terminal, the first signal and the second signal having a cause-effect relationship;
    obtaining a first time value according to the first timing signals;
    generating a third signal from the first signal terminal;
    obtaining a plurality of second timing signals according to the third signal;
    receiving a fourth signal from the second signal terminal, the third signal and the fourth signal having a cause-effect relationship; and
    obtaining a second time value according to the second timing signals.

10. The method for adjusting a signal length of claim 9, wherein the step of obtaining the second time value further comprises the following steps:

locking a status of the second timing signals; and encoding the second timing signals according to the status of the second timing signals to generate the second time value.

11. The method for adjusting a signal length of claim 9, wherein the third signal and the first signal are generated by a first signal source, the third signal is generated after the first signal, the fourth signal and the second signal are generated by a second signal source, and the fourth signal is generated after the second signal.

12. The method for adjusting a signal length of claim 9, further comprising the following steps:

comparing the first time value and the second time value; and adjusting a signal length of a fifth signal generated after the third signal from the first signal terminal.

13. The method for adjusting a signal length of claim 12, further comprising the following steps:

adjusting the length of the fifth signal to be larger than a length of the third signal, if the second time value is larger than the first time value;

adjusting the length of the fifth signal to be smaller than the length of the third signal, if the second time value is smaller than the first time value; and maintaining the length of the fifth signal to be equal to a length of the third signal, if the second time value is equal to the first time value.

14. The method for adjusting a signal length of claim 12, wherein the electronic storage device comprises a memory device.

15. The method for adjusting a signal length of claim 14, wherein the first signal, the third signal and the fifth signal are address transition detection signals of the memory device.

16. The method for adjusting a signal length of claim 14, wherein the second signal and the fourth signal are generated when the data output from a data line of the memory device vary.

* * * * *